United States Patent
Quli

(10) Patent No.: US 10,796,969 B2
(45) Date of Patent: Oct. 6, 2020

(54) SYSTEM AND METHOD FOR FABRICATING SEMICONDUCTOR WAFER FEATURES HAVING CONTROLLED DIMENSIONS

(71) Applicant: KLA-Tencor Corporation, Milpitas, CA (US)

(72) Inventor: Farhat A. Quli, Castro Valley, CA (US)

(73) Assignee: KLA-TENCOR CORPORATION, Milpitas, CA (US)

(*) Notice: Subject to any disclaimer, the term of this patent is extended or adjusted under 35 U.S.C. 154(b) by 0 days.

(21) Appl. No.: 16/184,898

(22) Filed: Nov. 8, 2018

(65) Prior Publication Data

US 2020/0083122 A1    Mar. 12, 2020

Related U.S. Application Data

(60) Provisional application No. 62/728,664, filed on Sep. 7, 2018.

(51) Int. Cl.
| | |
|---|---|
| *H01L 21/66* | (2006.01) |
| *H01L 21/308* | (2006.01) |
| *H01L 21/02* | (2006.01) |
| *H01L 21/306* | (2006.01) |

(52) U.S. Cl.
CPC ........ *H01L 22/12* (2013.01); *H01L 21/02164* (2013.01); *H01L 21/02255* (2013.01); *H01L 21/02271* (2013.01); *H01L 21/308* (2013.01); *H01L 21/30625* (2013.01)

(58) Field of Classification Search
None
See application file for complete search history.

(56) References Cited

U.S. PATENT DOCUMENTS

| | | | |
|---|---|---|---|
| 6,339,000 B1 * | 1/2002 | Bhattacharya | .... H01L 29/40114 438/261 |
| 8,003,940 B2 | 8/2011 | Oosaki et al. | |
| 8,126,255 B2 | 2/2012 | Bhaskar et al. | |

(Continued)

FOREIGN PATENT DOCUMENTS

| | | |
|---|---|---|
| KR | 20100137212 A | 12/2010 |
| KR | 20140131681 A | 11/2014 |

OTHER PUBLICATIONS

International Search Report and Written Opinion from PCT Application No. PCT/US2019/049611, dated Dec. 20, 2019.

*Primary Examiner* — Allan W. Olsen
(74) *Attorney, Agent, or Firm* — Zilka-Kotab, P.C.

(57) ABSTRACT

A system and method are provided for fabricating semiconductor wafer features with controlled dimensions. In use, a top surface of a semiconductor wafer is identified. A first portion of the top surface of the semiconductor wafer is then vertically etched to form a step down from a second portion of the top surface of the semiconductor wafer, the step comprised of a horizontal face and a vertical sidewall. Additionally, a film is uniformly deposited across the horizontal face and the vertical sidewall of the step. Further, the second portion of the top surface of the semiconductor wafer is vertically etched to expose, as a feature of the semiconductor wafer, the film deposited across the vertical sidewall of the step.

11 Claims, 8 Drawing Sheets

(56) References Cited

U.S. PATENT DOCUMENTS

| | | | |
|---|---|---|---|
| 8,129,242 B2* | 3/2012 | Luo | H01L 27/115 |
| | | | 438/261 |
| 9,293,298 B2 | 3/2016 | Lauber | |
| 10,353,127 B2* | 7/2019 | Wang | G02B 5/1857 |
| 2002/0127818 A1* | 9/2002 | Lee | H01L 21/76224 |
| | | | 438/424 |
| 2003/0042520 A1* | 3/2003 | Tsukamoto | H01L 27/105 |
| | | | 257/296 |
| 2006/0205136 A1* | 9/2006 | Tessariol | H01L 27/115 |
| | | | 438/211 |
| 2006/0281266 A1 | 12/2006 | Wells | |
| 2007/0087502 A1* | 4/2007 | Chung-Zen | H01L 27/115 |
| | | | 438/257 |
| 2012/0181665 A1 | 7/2012 | Kwon | |
| 2014/0346612 A1 | 11/2014 | Adam et al. | |
| 2017/0373161 A1* | 12/2017 | Schroeder | H01L 29/41791 |
| 2018/0113975 A1* | 4/2018 | Sherazi | H01L 27/1104 |
| 2019/0214473 A1* | 7/2019 | Xie | H01L 29/66795 |

* cited by examiner

SYSTEM AND METHOD FOR FABRICATING SEMICONDUCTOR WAFER FEATURES HAVING CONTROLLED DIMENSIONS

RELATED APPLICATION(S)

This application claims the benefit of U.S. Provisional Patent Application No. 62/728,664, filed Sep. 7, 2018, the entire contents of which are incorporated herein by reference.

FIELD OF THE INVENTION

The present invention relates to fabrication of semiconductor wafers, and more particularly to processes for fabricating features of semiconductor wafers for use as dimensional standards.

BACKGROUND

Existing processes for fabricating semiconductor wafers involve fabricating the features of semiconductor wafers in accordance with defined dimensions. In order to produce semiconductor wafers that function as expected, it is desirable for the actual feature dimensions on the fabricated semiconductor wafer to align as close as possible to the defined dimensions. Further, in some specific applications, semiconductor wafers are fabricated for use in calibration, or matching, of metrology tools, which requires the actual feature dimensions on these fabricated semiconductor wafers be within an allowable tolerance from the defined dimensions. There is thus a need for semiconductor wafer fabrication processes that provide wafer features having controlled dimensions.

One existing fabrication process made by VSLI Standards, Inc. Standards consists of a film stack of precisely controlled thicknesses (in the z dimension) that is diced out of a wafer and then mounted on its edge in order for the controlled z dimension to translate in an x/y dimension. The advantage of such processes is that it is easier to grow films of uniform and controlled thickness rather than to create uniform features in the x/y dimension using lithography. However, the disadvantage to this existing process is that it requires expensive and time-consuming bonding, dicing, polishing, and then etching processes, and even further the dice require remounting to another substrate with attention to orienting the features perpendicularly.

There is thus a need for addressing these and/or other issues associated with the prior art.

SUMMARY

A system and method are provided for fabricating semiconductor wafer features with controlled dimensions. In use, a top surface of a semiconductor wafer is identified. A first portion of the top surface of the semiconductor wafer is then vertically etched to form a step down from a second portion of the top surface of the semiconductor wafer, the step comprised of a horizontal face and a vertical sidewall. Additionally, a film is uniformly deposited across the horizontal face and the vertical sidewall of the step. Further, the second portion of the top surface of the semiconductor wafer is vertically etched to expose, as a feature of the semiconductor wafer, the film deposited across the vertical sidewall of the step.

DETAILED DESCRIPTION

Figure 1A:
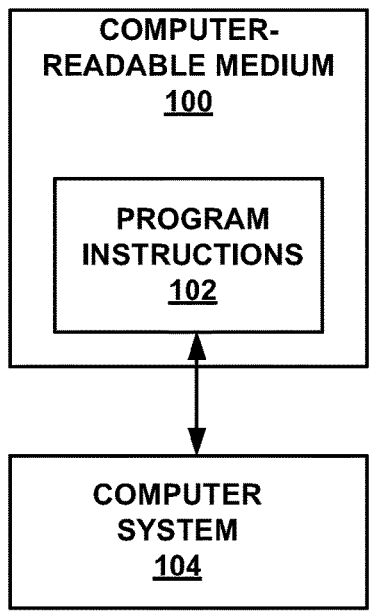
FIG. 1A shows a block diagram illustrating one embodiment of a non-transitory computer-readable medium that includes program instructions executable on a computer system for performing one or more of the computer-implemented methods described herein.
Figure 1B:
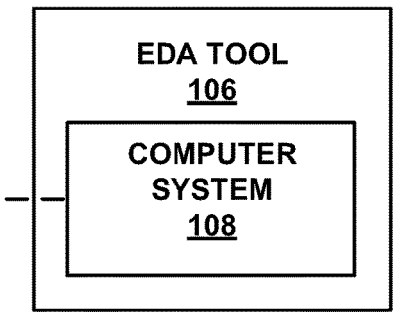
FIG. 1B is a schematic diagram illustrating a side view of one embodiment of an inspection system configured to detect defects on a fabricated device.
Figure 1B:
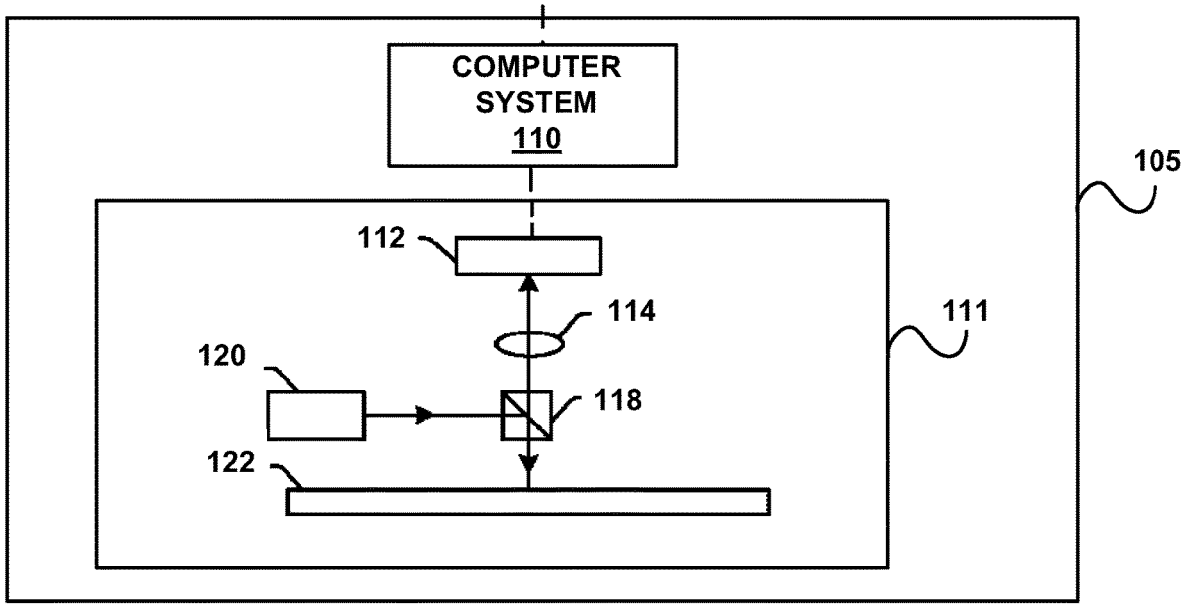

The following description discloses a system and method for fabricating semiconductor wafer features with controlled dimensions. Once the wafer is fabricated, it may be inspected for various purposes using an inspection system, such as to detect defects, calibrate the inspection (e.g. metrology) system, or to perform measurement matching between different inspection (e.g. metrology) systems. FIGS. 1A-1B describe various embodiments of an inspection system.

As shown in FIG. 1A, computer-readable medium 100 includes program instructions 102 executable on computer system 104. The program instructions 102 may be executed for the various purposes noted above, such as to detect defects, calibrate the inspection (e.g. metrology) system, or to perform measurement matching between different inspection (e.g. metrology) systems.

Program instructions 102 may be stored on computer-readable medium 100. The computer-readable medium may be a storage medium such as a magnetic or optical disk, or a magnetic tape or any other suitable non-transitory computer-readable medium known in the art. As an option, computer-readable medium 100 may be located within computer system 104.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

The computer system 104 may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer system 104 may also include any suitable processor known in the art such as a parallel processor. In addition, the computer system 104 may include a computer platform with high speed processing and software, either as a standalone or a networked tool.

In one embodiment, the computer system 104 may be a subsystem of a larger system that also includes an inspection system 105, as shown in FIG. 1B. The system includes inspection system 105 configured to generate output for a feature fabricated on a wafer (or other device), which is configured in this embodiment as described further herein. The system also includes one or more computer systems. The one or more computer systems may be configured to perform the operations described above. The computer system(s) and the system may also be configured to perform any other operations described herein and may be further configured as described herein.

In the embodiment shown in FIG. 1B, one of the computer systems is part of an electronic design automation (EDA) tool, and the inspection system and another of the computer systems are not part of the EDA tool. These computer systems may include, for example, the computer system 104 described above with reference to FIG. 1A. For example, as shown in FIG. 1B, one of the computer systems may be computer system 108 included in EDA tool 106. The EDA tool 106 and the computer system 108 included in such a tool may include any commercially available EDA tool.

The inspection system 105 may be configured to generate the output for the feature on a wafer by scanning the wafer with light and detecting light from the wafer during the scanning. For example, as shown in FIG. 1B, the inspection system 105 includes light source 120, which may include any suitable light source known in the art. Light from the light source may be directed to beam splitter 118, which may be configured to direct the light from the light source to wafer 122. The light source 120 may be coupled to any other suitable elements (not shown) such as one or more condensing lenses, collimating lenses, relay lenses, objective lenses, apertures, spectral filters, polarizing components and the like. As shown in FIG. 1B, the light may be directed to the wafer 122 at a normal angle of incidence. However, the light may be directed to the wafer 122 at any suitable angle of incidence including near normal and oblique incidence. In addition, the light or multiple light beams may be directed to the wafer 122 at more than one angle of incidence sequentially or simultaneously. The inspection system 105 may be configured to scan the light over the wafer 122 in any suitable manner.

Light from wafer 122 may be collected and detected by one or more channels of the inspection system 105 during scanning. For example, light reflected from wafer 122 at angles relatively close to normal (i.e., specular reflected light when the incidence is normal) may pass through beam splitter 118 to lens 114. Lens 114 may include a refractive optical element as shown in FIG. 1B. In addition, lens 114 may include one or more refractive optical elements and/or one or more reflective optical elements. Light collected by lens 114 may be focused to detector 112. Detector 112 may include any suitable detector known in the art such as a charge coupled device (CCD) or another type of imaging detector. Detector 112 is configured to generate output that is responsive to the reflected light collected by lens 114. Therefore, lens 114 and detector 112 form one channel of the inspection system 105. This channel of the inspection system 105 may include any other suitable optical components (not shown) known in the art.

Since the inspection system shown in FIG. 1B is configured to detect light specular reflected from the wafer 122, the inspection system 105 is configured as a (bright field) BF inspection system. Such an inspection system 105 may, however, also be configured for other types of wafer inspection. For example, the inspection system shown in FIG. 1B may also include one or more other channels (not shown). The other channel(s) may include any of the optical components described herein such as a lens and a detector, configured as a scattered light channel. The lens and the detector may be further configured as described herein. In this manner, the inspection system 105 may also be configured for (dark field) DF inspection.

The inspection system 105 may also include a computer system 110. For example, the optical elements described above may form optical subsystem 111 of inspection subsystem 105, which may also include computer system 110 that is coupled to the optical subsystem 111. In this manner, output generated by the detector(s) during scanning may be provided to computer system 110. For example, the computer system 110 may be coupled to detector 112 (e.g., by one or more transmission media shown by the dashed line in FIG. 1B, which may include any suitable transmission media known in the art) such that the computer system 110 may receive the output generated by the detector.

The computer system 110 of the inspection system 105 may be configured to perform any of the operations described above. For example, computer system 110 may be configured for systematic and stochastic characterization of pattern defects identified from the wafer, or for measuring features of the wafer. In addition, the one or more of the computer system(s) may be configured as a virtual inspector such as that described in U.S. Pat. No. 8,126,255 issued on Feb. 28, 2012 to Bhaskar et al., which is incorporated by reference as if fully set forth herein.

The computer system 110 of the inspection system 105 may also be coupled to another computer system that is not part of the inspection system such as computer system 108, which may be included in another tool such as the EDA tool 106 described above such that computer system 110 can receive output generated by computer system 108, which may include a design generated by that computer system 108. For example, the two computer systems may be effectively coupled by a shared computer-readable storage medium such as a fab database or may be coupled by a transmission medium such as that described above such that information may be transmitted between the two computer systems.

It is noted that FIG. 1B is provided herein to generally illustrate a configuration of an inspection system that may be utilized as described herein. Obviously, the inspection system configuration described herein may be altered to optimize the performance of the inspection system as is normally performed when designing a commercial inspection system. In addition, the systems described herein may be implemented using an existing inspection system (e.g., by adding functionality described herein to an existing inspection system) such as the 29xx/28xx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

In a further embodiment, the inspection system 105 may be directly or indirectly coupled to a review system (not shown), such as the SEM review system disclosed in U.S. Pat. No. 9,293,298. The SEM review system may be operable to review defects detected by the inspection system 105 for classification of the defects, which in turn can be used to train the inspection system 105 for better defect detection.

Figure 2:
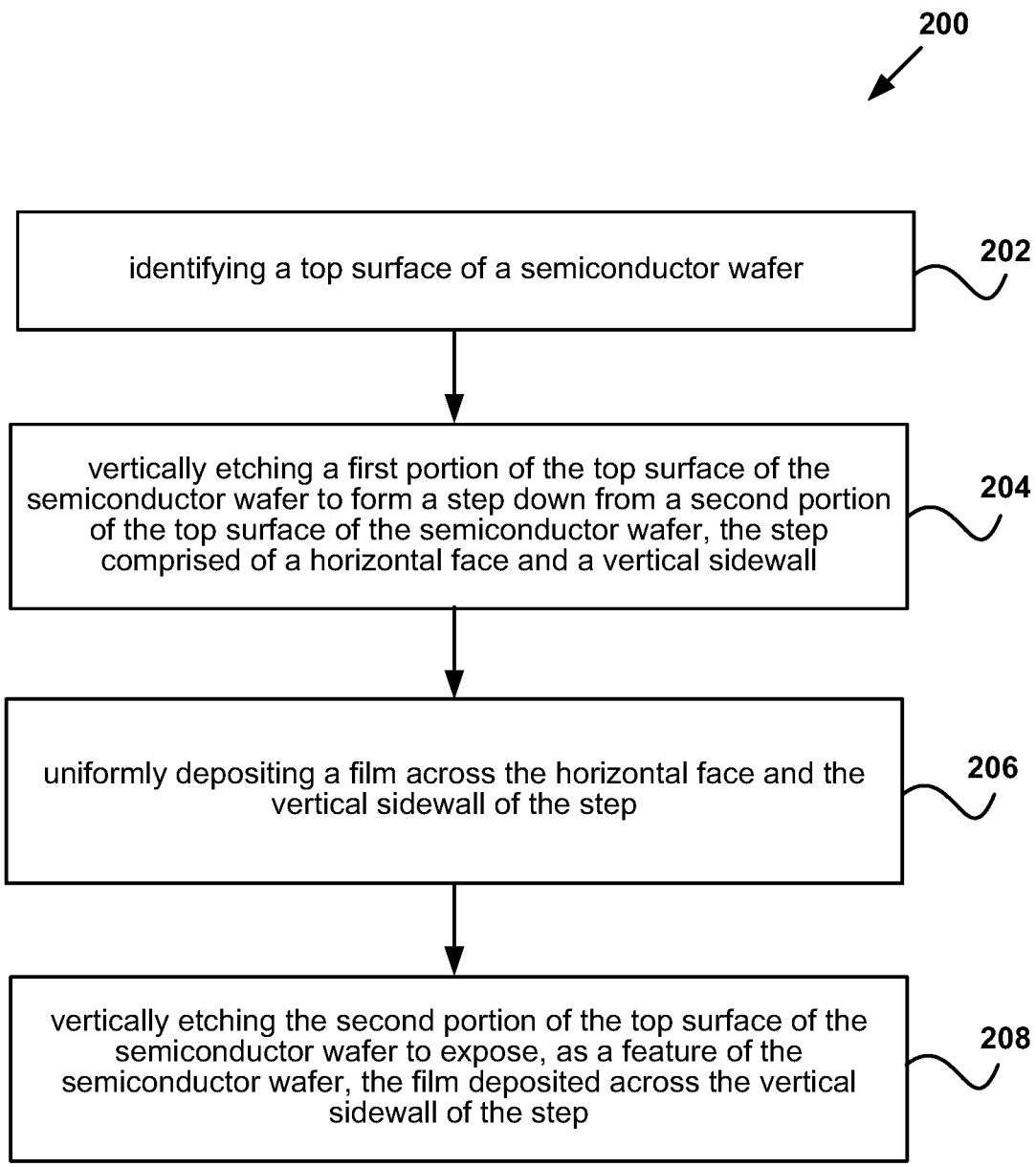
FIG. 2 shows a method for fabricating semiconductor wafer features with controlled dimensions, in accordance with an embodiment.

FIG. 2 shows a method 200 for fabricating semiconductor wafer features with controlled dimensions, in accordance with an embodiment. The method 200 may be carried out by any system having hardware components configured for fabricating semiconductor wafer features in the manner described. For example, the method 200 may be carried out by the system 400 described below with reference to FIG. 4.

As shown in operation 202, a top surface of a semiconductor wafer is identified. The semiconductor wafer may be any wafer comprised of semiconductor material. Accordingly, the top surface of the semiconductor wafer may be a substrate of semiconductor material.

For example, in one embodiment, the semiconductor wafer may be a silicon wafer (i.e. comprised of silicon material). In this embodiment, the top surface of the semiconductor wafer may be a silicon substrate, such as (110) silicon. In another embodiment, the top surface of the semiconductor wafer may be a hard mask deposited on the substrate of the semiconductor wafer. In this embodiment, the hard mask may be silicon nitride.

As shown in operation 204, a first portion of the top surface of the semiconductor wafer is vertically etched to form a step down from a second portion of the top surface of the semiconductor wafer. As a result of the vertical etching, the step comprises a horizontal face (at a lower height than the second portion of the top surface of the semiconductor wafer) and a vertical sidewall (extending from the second portion of the top surface of the semiconductor wafer to the horizontal face). The vertical etching may include wet etching or dry etching.

In the embodiment described above where the top surface of the semiconductor wafer is a hard mask deposited on the substrate of the semiconductor wafer, vertically etching the first portion of the top surface of the semiconductor wafer may include vertically etching through a first portion of the hard mask and a first portion of the substrate (silicon) of the semiconductor wafer on which the first portion of the hard mask is deposited. In any case, it should be noted that the first portion of the top surface of the semiconductor wafer may be vertically etched to any desired depth.

Additionally, as shown in operation 206, a film is uniformly deposited across the horizontal face and the vertical sidewall of the step. The film may include thermal silicon oxide, for example. As another example, the film may include a vapor grown metal. Of course, however, the film may include any other film material as long as the second portion of the top surface of the semiconductor wafer can be vertically etched and thus removed from the film deposited on the vertical sidewall of the step, the reasons for which will be noted in further detail below.

To this end, in various embodiments, the film may be uniformly deposited by thermal oxidation, by chemical vapor deposition, or any other process capable of uniformly depositing the film across the horizontal face and the vertical sidewall of the step. By uniformly depositing the film across the horizontal face and the vertical sidewall of the step, a width of the film deposited on the surface of the step may be controlled. For example, the film deposition process that is used may be controlled to deposit the film with a desired, and uniform, thickness.

Further, as shown in operation 208, the second portion of the top surface of the semiconductor wafer is vertically etched to expose, as a feature of the semiconductor wafer, the film deposited across the vertical sidewall of the step. In one embodiment, vertically etching the second portion of the top surface of the semiconductor wafer may include partially removing, in a vertical direction, the second portion of the top surface of the semiconductor wafer. In another embodiment, vertically etching the second portion of the top surface of the semiconductor wafer may include fully removing, in a vertical direction, the second portion of the top surface of the semiconductor wafer. By vertically etching the second portion of the top surface of the semiconductor wafer to expose the film deposited across the vertical sidewall of the step as a feature, a height of the feature may be controlled.

Accordingly, the feature may be characterized by the width of the film deposited across the vertical sidewall of the step. In this way, a controlled dimension of the feature, namely the width of the feature, may be provided by controlling the film deposition and etching processes described above.

It should be noted that a plurality of features of the semiconductor wafer may be formed by repeating the method 200 for different locations of the top surface of the semiconductor wafer. The method 200 may also be performed simultaneously in the multiple different locations of the top surface of the semiconductor wafer. These features may vary in width, height, and shape, in a controlled manner, by controlling the film deposition and etching process to fabricate each feature.

In the manner described above, the method 200 may provide a well characterized and repeatable dimensional standard for semiconductor wafer features. This may allow these features to be used in the calibration of metrology tools that measure features of less than 100 nm as in the measurement of critical dimensions (CD) in the semiconductor industry, such as Critical Dimension Atomic Force Microscopy (CD-AFM) tools and Critical Dimension Scanning Electron Microscope (CD-SEM) tools. This may also allow these features to be used for measurement matching across different metrology tools, such as the tool matching method for SEMs disclosed in U.S. Pat. No. 8,003,940.

In addition, the method 200 may provide these controlled features with a simpler film stack than those from the prior art, by eliminating the need for wafer bonding, die polishing, or orienting and mounting to other substrates. The method 200 may further provide the ability to fabricate semiconductor wafer features of a variety of shapes and sizes, and using different film materials, as desired.

More illustrative information will now be set forth regarding various optional architectures and uses in which the foregoing method may or may not be implemented, per the desires of the user. It should be noted that the following information is set forth for illustrative purposes and should not be construed as limiting in any manner. Any of the following features may be optionally incorporated with or without the exclusion of other features described.

Figure 3A:
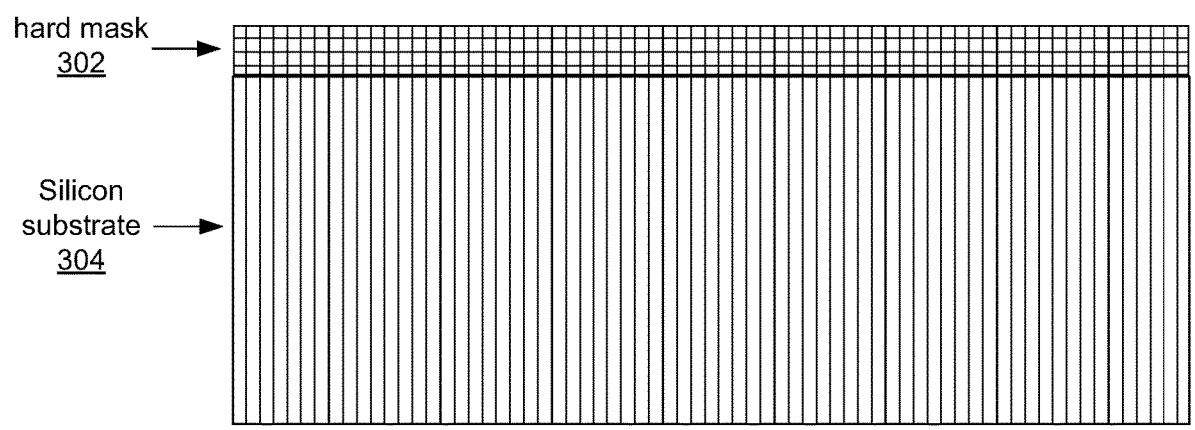
FIG. 3A illustrates a top surface of a semiconductor wafer, in accordance with an embodiment.

FIG. 3A illustrates a top surface of a semiconductor wafer, in accordance with an embodiment. As shown, the semiconductor wafer includes a hard mask 302 deposited on a silicon substrate 304. The hard mask 302 may be silicon nitride and the silicon substrate may be (110) silicon. It should be noted that the hard mask 302 may be deposited and patterned across an entire surface of the silicon substrate 304 or a partial surface of the silicon substrate 304, in different applications.

Figure 3B:
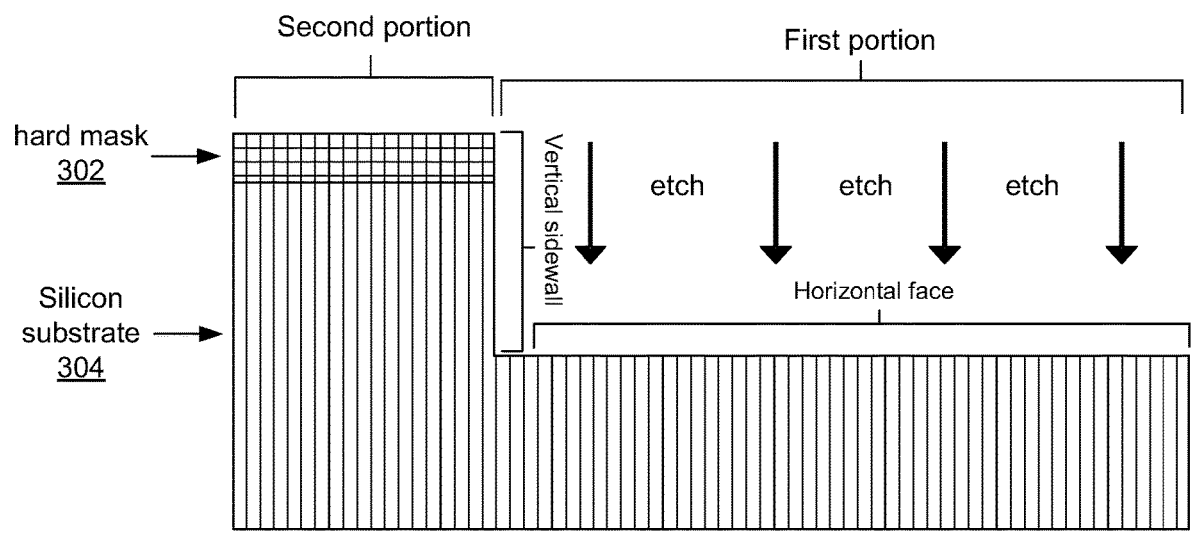
FIG. 3B illustrates the vertical etching of a first portion of the top surface of the semiconductor wafer of FIG. 3A to form a step down from a second portion of the top surface of the semiconductor wafer, in accordance with an embodiment.

FIG. 3B illustrates the vertical etching of a first portion of the top surface of the semiconductor wafer of FIG. 3A to form a step down from a second portion of the top surface of the semiconductor wafer, in accordance with an embodiment. The step is comprised of a vertical sidewall (with a height equal to a depth of the vertical etching) and horizontal face (with a length equal to a length of the first portion of the top surface of the semiconductor wafer), as shown. The vertical etching can be performed using wet etching, such as by a wet anisotropic process (e.g. KOH) that is highly uniform and that results in straight lines and the vertical sidewall on (110) silicon wafers. As another option, the vertical etching can be performed using dry etching, such as by a reactive ion etch process (e.g. the Bosch process), which can vary the shape (in a controlled manner) of the resulting step.

As an option, chemical mechanical polishing of the step may be performed, in the context of FIG. 3B. This may sharpen the angle of the step, to enable a sharper resulting feature, as described in more detail below.

Figure 3C:
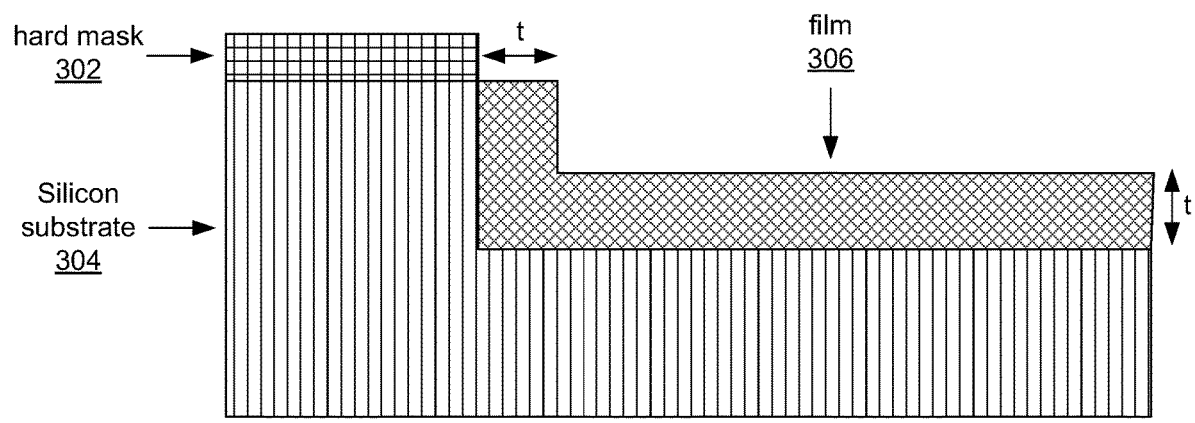
FIG. 3C illustrates the uniform deposition of a film across a horizontal face and a vertical sidewall of the step of FIG. 3B, in accordance with an embodiment.

FIG. 3C illustrates the uniform deposition of a film across a horizontal face and a vertical sidewall of the step of FIG. 3B, in accordance with an embodiment. As shown, a film 306, such as thermal silicon oxide, is deposited (grown) uniformly across the horizontal face and the vertical sidewall of the step. Other film materials may also be used, other than thermal silicon oxide, such as vapor grown metals, as long as the second portion of the top surface of the semiconductor wafer can be etched from the film 306 (as described below with reference to FIG. 3D). Use of vapor grown metals may be beneficial for creating the semiconductor wafer feature since a feature of this material may provide greater imaging contrast in certain inspection tools. In any case, the uniform deposition of the film 306 results in a consistent thickness (t) of the film 306 over the horizontal face and the vertical sidewall of the step.

As an option, after uniformly depositing the film 306, chemical mechanical planarization (CMP) may be performed on the second portion of the top surface of the semiconductor wafer. This may remove the hard mask 302 and reduce the step height. Importantly, this may remove interfacial non-stochiometric compositions at the junction of the silicon substrate 304, hard mask 302, and film 306 that may not otherwise etch into a clean feature via the vertical etching described in FIG. 3D.

Figure 3D:
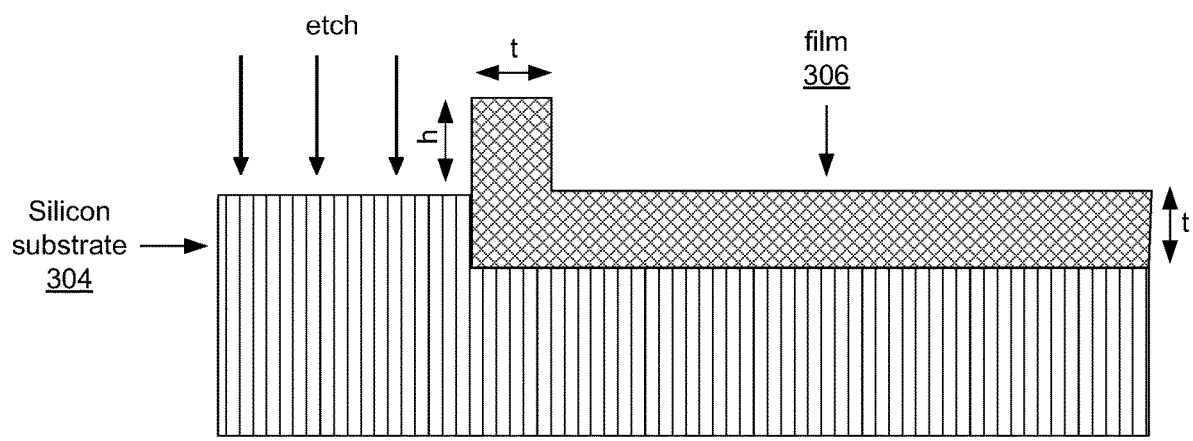
FIG. 3D illustrates the vertical etching of the second portion of the top surface of the semiconductor wafer of FIG. 3C to expose, as a feature of the semiconductor wafer, the film deposited across the vertical sidewall of the step, in accordance with an embodiment.

FIG. 3D illustrates the vertical etching of the second portion of the top surface of the semiconductor wafer of FIG. 3C to expose, as a feature of the semiconductor wafer, the film deposited across the vertical sidewall of the step, in accordance with an embodiment. In one embodiment, the vertical etching may be performed on the second portion of the top surface of the semiconductor wafer (indicated in FIG. 3B), including vertically through the hard mask 302 and a part of, the silicon substrate 304. As a result, the film 306 deposited across the vertical sidewall of the step is freed in part from the sidewall, and forms a vertical feature of the semiconductor wafer characterized by a width (t) of the film 306 and a height (h) corresponding to the depth of the vertical etching shown.

Figure 3E:
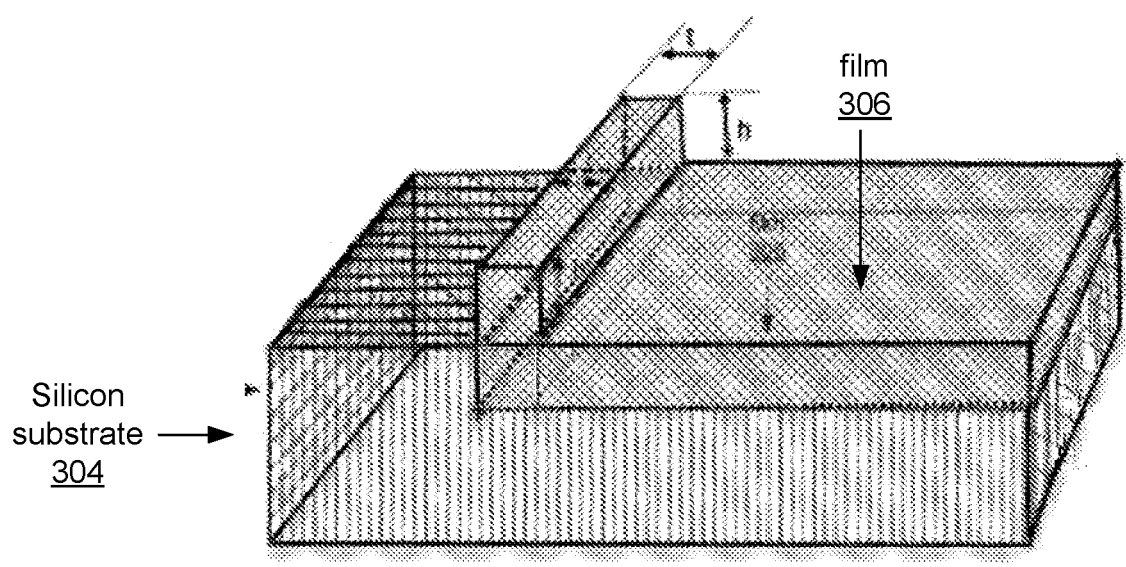
FIG. 3E illustrates a 3-dimensional view of the feature of FIG. 3D, in accordance with an embodiment.

FIG. 3E illustrates a 3-dimensional view of the feature of FIG. 3D, in accordance with an embodiment. As shown, the feature resulting from the fabrication process described with reference to FIGS. 3A-D is characterized by width (t) and height (h), and is formed from the film 306 material deposited on the silicon substrate 302.

The semiconductor wafer feature can be used on the existing silicon substrate 302 after characterization with elipsometry (if transparent). It can also be diced and mounted on other substrates (wafers or masks) as a cost reduction measure (one processed wafer could result in thousands of usable features). Through elipsometry and/or cross-sectional transmission electron microscopy (TEM), the thickness of the film 306, and resulting width of the semiconductor wafer feature can be characterized to a traceable standard, such as the atomic lattice of single crystal silicon or the He—Ne laser wavelength. The feature can then be used for tool matching or calibration of CD-AFMs or CD-SEMs.

Figure 4:
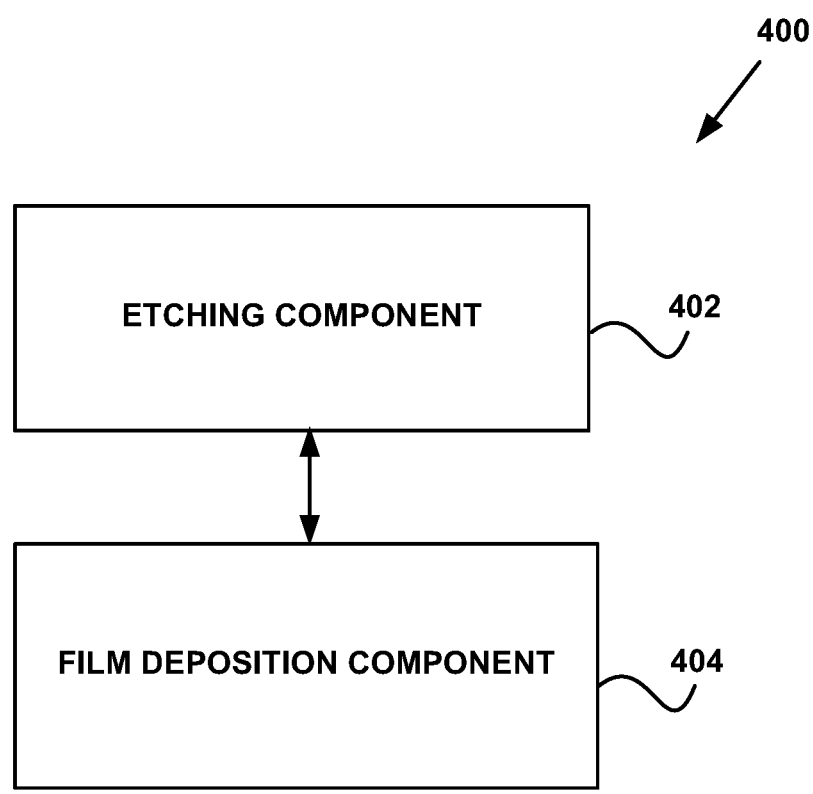
FIG. 4 illustrates a system for fabricating semiconductor wafer features with controlled dimensions, in accordance with an embodiment.

FIG. 4 illustrates a system 400 for fabricating semiconductor wafer features with controlled dimensions, in accordance with an embodiment. The system 400 may be implemented to carry out the method 200 of FIG. 2 and/or the process described above with reference to FIGS. 3A-3E. It should be noted that the system 400 is not limited to the components shown, but may include additional components as is understood in the relevant art. Further, the components of the system 400 are hardware components configured for fabricating semiconductor wafer features with controlled dimensions.

As shown, the system 400 includes an etching component 402. The etching component vertically etches a first portion of a top surface of a semiconductor wafer to form a step down from a second portion of the top surface of the semiconductor wafer, where the step is comprised of a horizontal face and a vertical sidewall (see operation 204 of FIG. 2 and/or FIG. 3B). The system 400 also includes a film deposition component 404 that uniformly deposits a film across the horizontal face and the vertical sidewall of the step (see operation 206 of FIG. 2 and/or FIG. 3C). The etching component 402 further vertically etches the second portion of the top surface of the semiconductor wafer to expose, as a feature of the semiconductor wafer, the film deposited across the vertical sidewall of the step (see operation 208 and/or FIG. 3D).

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
identifying a top surface of a semiconductor wafer, wherein the top surface of the semiconductor wafer is a hard mask deposited on a substrate of the semiconductor wafer;
vertically etching a first portion of the top surface of the semiconductor wafer to a select depth to form a step down from a second portion of the top surface of the semiconductor wafer, the step comprised of:
a horizontal face at a lower height than the second portion of the top surface of the semiconductor wafer, and
a vertical sidewall extending from the second portion of the top surface of the semiconductor wafer to the horizontal face;
performing chemical mechanical polishing (CMP) of the step;
after performing the CMP of the step, uniformly depositing a film of a select thickness across the horizontal face and the vertical sidewall of the step;
after uniformly depositing the film across the horizontal face and the vertical sidewall of the step, performing CMP on the second portion of the top surface of the semiconductor wafer to reduce a height of the step;

after performing the CMP on the second portion of the top surface of the semiconductor wafer to reduce a height of the step, vertically etching, to a select depth, the second portion of the top surface of the semiconductor wafer from the film by vertically etching through a first portion of the hard mask and a first portion of the substrate of the semiconductor wafer on which the first portion of the hard mask is deposited, to expose, as a feature of the semiconductor wafer, the film deposited across the vertical sidewall of the step, wherein dimensions of the feature are controlled according to the select thickness by which the film is deposited and the select depth by which the second portion of the top surface of the semiconductor wafer is vertically etched.

2. The method of claim 1, wherein the semiconductor wafer is a silicon wafer.

3. The method of claim 1, wherein the substrate of the semiconductor wafer is a silicon substrate.

4. The method of claim 1, wherein the hard mask is silicon nitride.

5. The method of claim 1, wherein the first portion of the top surface of the semiconductor wafer is vertically etched using wet etching.

6. The method of claim 1, wherein the first portion of the top surface of the semiconductor wafer is vertically etched using dry etching.

7. The method of claim 1, wherein the film of the select thickness is uniformly deposited across the vertical sidewall of the step by thermal oxidation.

8. The method of claim 1, wherein the film is uniformly deposited with the controlled width across the vertical sidewall of the step by chemical vapor deposition.

9. The method of claim 1, wherein the feature is utilized for calibration of a metrology tool.

10. The method of claim 1, wherein the feature is utilized for measurement matching among a plurality of metrology tools.

11. The method of claim 1, wherein a plurality of features of the semiconductor wafer are formed by repeating, for different locations of the top surface of the semiconductor wafer, the vertical etching of the first portion of the top surface of the semiconductor wafer, the uniform depositing of the film, and the vertical etching of the second portion of the top surface of the semiconductor wafer.

* * * * *